(12) United States Patent
Fujiya et al.

(10) Patent No.: US 10,847,472 B2
(45) Date of Patent: Nov. 24, 2020

(54) ELASTIC WAVE DEVICE

(71) Applicant: Murata Manufacturing Co., Ltd., Nagaokakyo (JP)

(72) Inventors: Masaharu Fujiya, Nagaokakyo (JP); Takahiro Norichi, Nagaokakyo (JP); Tatsuya Ikeshima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 11 days.

(21) Appl. No.: 16/383,702

(22) Filed: Apr. 15, 2019

(65) Prior Publication Data

US 2019/0333863 A1    Oct. 31, 2019

(30) Foreign Application Priority Data

Apr. 26, 2018  (JP) .................. 2018-085109

(51) Int. Cl.
| | |
|---|---|
| H01L 23/544 | (2006.01) |
| H03H 9/02 | (2006.01) |
| H03H 9/145 | (2006.01) |
| H03H 9/64 | (2006.01) |
| H03H 9/25 | (2006.01) |

(52) U.S. Cl.
CPC ....... H01L 23/544 (2013.01); H03H 9/02834 (2013.01); H03H 9/02897 (2013.01); H03H 9/02937 (2013.01); H03H 9/02992 (2013.01); H03H 9/145 (2013.01); H03H 9/25 (2013.01); H03H 9/6483 (2013.01); H03H 9/6489 (2013.01); *H01L 2223/5442* (2013.01); *H01L 2223/54406* (2013.01); *H01L 2223/54413* (2013.01); *H01L 2223/54433* (2013.01)

(58) Field of Classification Search
CPC ......... H01L 23/544; H01L 2223/54433; H01L 2223/54406; H01L 2223/54413; H01L 2223/5442; H01L 2223/54426; H03H 9/02834; H03H 9/02897; H03H 9/02937; H03H 9/02992; H03H 9/145; H03H 9/6483; H03H 9/6489; H03H 9/25
USPC ........................................ 333/133, 193–196
See application file for complete search history.

(56) References Cited

U.S. PATENT DOCUMENTS

| | | | |
|---|---|---|---|
| 2016/0126931 A1* | 5/2016 | Tsuda ................ | H03H 9/64 333/195 |
| 2017/0063337 A1* | 3/2017 | Hara ................ | H03H 9/6433 |

FOREIGN PATENT DOCUMENTS

| | | | | |
|---|---|---|---|---|
| JP | 2017-28543 A | 2/2017 | | |
| WO | WO-2017033575 A1 * | 3/2017 | ......... | H03H 9/02559 |

OTHER PUBLICATIONS

Machine English Translation of WO2017033575 Published on Mar. 2, 2017 (Year: 2017).*

* cited by examiner

*Primary Examiner* — Rakesh B Patel
*Assistant Examiner* — Jorge L Salazar, Jr.
(74) *Attorney, Agent, or Firm* — Keating & Bennett, LLP (57) ABSTRACT

An elastic wave device includes a substrate, an IDT electrode, a wire, an electrically insulating film, and an identification marking. The substrate has piezoelectricity. The IDT electrode is provided on the substrate and includes a pair of comb-shaped electrodes facing each other. The wire is provided on the substrate and connected to the IDT electrode. The electrically insulating film is provided at least on the IDT electrode and the wire. The identification marking is defined by an uneven portion of a surface of the electrically insulating film. The identification marking does not to overlap the IDT electrode in plan view of the substrate.

20 Claims, 5 Drawing Sheets

ELASTIC WAVE DEVICE

CROSS REFERENCE TO RELATED APPLICATIONS

This application claims the benefit of priority to Japanese Patent Application No. 2018-085109 filed on Apr. 26, 2018. The entire contents of this application are hereby incorporated herein by reference.

BACKGROUND OF THE INVENTION

1. Field of the Invention

The present invention relates to an elastic wave device including an elastic wave resonator.

2. Description of the Related Art

An elastic wave filter in which an interdigital transducer (IDT) electrode is formed on a piezoelectric substrate is widely used, for example, for a band pass filter that is disposed at a front-end portion of a mobile communication terminal. To support multifunctionality, such as multiband/multimode functionality, a plurality of elastic wave filters are disposed at the front-end portion, and therefore, it is desirable to reduce the size of an elastic wave filter.

Japanese Unexamined Patent Application Publication No. 2017-028543 describes an elastic wave device in which an IDT electrode formed on the surface of a piezoelectric substrate is coated with a protective film made of an electrically insulating material. An identification pattern is provided on the surface of the piezoelectric substrate. The identification pattern is made of a metal material and is used for chip identification or other purposes.

However, when an identification pattern is made of a metal material as in the case of the elastic wave device described in Japanese Unexamined Patent Application Publication No. 2017-028543, a radio-frequency signal that propagates through the IDT electrode may leak through a parasitic capacitance that occurs between the IDT electrode and the identification pattern. Thus, there is a problem that the propagation loss of the elastic wave device increases. In addition, when the distance between the identification pattern and the IDT electrode is increased to prevent the leakage of a radio-frequency signal, the size of the elastic wave device increases.

SUMMARY OF THE INVENTION

Preferred embodiments of the present invention provide small elastic wave devices each having good propagation characteristics without the effect of an identification marking.

According to a preferred embodiment of the present invention, an elastic wave device includes a substrate, an interdigital transducer electrode, a wire, an electrically insulating film, and an identification marking. The substrate has piezoelectricity. The interdigital transducer electrode is provided on the substrate and includes a pair of comb-shaped electrodes facing each other. The wire is provided on the substrate and connected to the interdigital transducer electrode. The wire propagates an electric signal to the interdigital transducer electrode or transmits an electric signal from the interdigital transducer electrode. The electrically insulating film is provided at least on the interdigital transducer electrode and the wire. The identification marking is defined by an uneven portion of a surface of the electrically insulating film. The identification marking does not overlap the interdigital transducer electrode in plan view of the substrate.

With elastic wave devices according to preferred embodiments of the present invention, deterioration of the propagation characteristics of surface acoustic waves that propagate through the interdigital transducer electrode due to the effect of the identification marking is reduced or prevented. In addition, since the identification marking is defined by the electrically insulating film that is required to ensure the reliability of the elastic wave device, the size of the elastic wave device is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings. Any of the preferred embodiments and the modifications that will be described below describes a general or specific example. Numeric values, shapes, materials, elements, disposition and connection structures of the elements, and other elements and features, that will be described in the following preferred embodiments and modifications are illustrative, and are not intended to limit the scope of the present invention. Of the elements in the following preferred embodiments and modifications thereof, the elements not included in the independent claims will be described as optional elements. In addition, the size or size ratio of elements illustrated in the drawings is not limiting.

Figure 1:
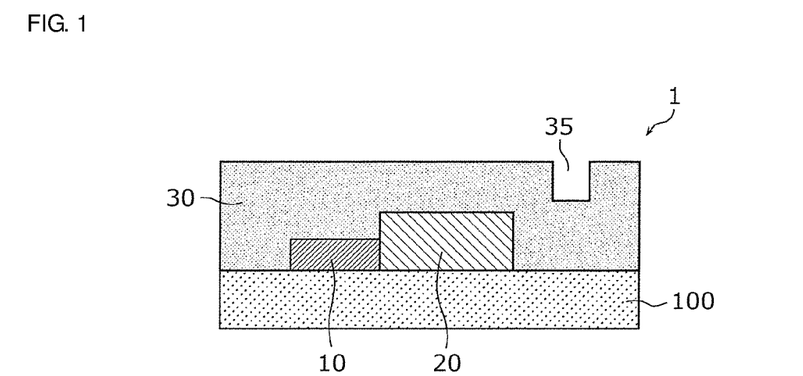
FIG. 1 is a sectional view of an elastic wave device according to a preferred embodiment of the present invention.
Figure 2:
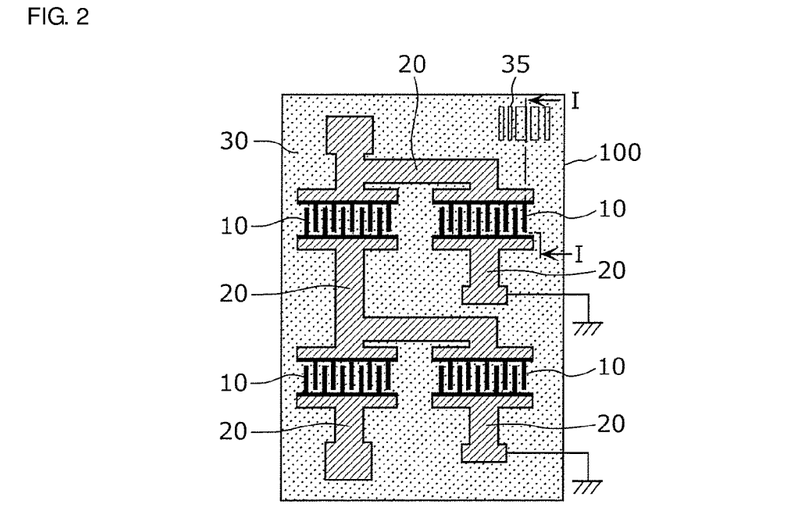
FIG. 2 is a plan view of an elastic wave device according to a preferred embodiment of the present invention.

FIG. 1 is a sectional view of an elastic wave device 1 according to a preferred embodiment of the present invention. FIG. 2 is a plan view of the elastic wave device 1 according to the present preferred embodiment. FIG. 1 is a sectional view taken along the line I-I in FIG. 2.

As illustrated in FIG. 1 and FIG. 2, the elastic wave device 1 according to the present preferred embodiment includes a substrate 100, interdigital transducer (IDT) electrodes 10, wires 20, an electrically insulating film 30, and an identification marking 35.

At least a portion of the substrate 100 has piezoelectricity. The substrate 100 may preferably, for example, include a piezoelectric thin film at its surface, and may include a laminate of the piezoelectric thin film, a film having an acoustic velocity different from that of the piezoelectric thin film, a support substrate, and other suitable films. The substrate may be any one of, for example, (1) a laminate including a high acoustic velocity support substrate and a piezoelectric thin film provided on the high acoustic velocity substrate, (2) a laminate including a high acoustic velocity substrate, a low acoustic velocity film provided on the high acoustic velocity substrate, and a piezoelectric thin film provided on the low acoustic velocity film, and (3) a laminate including a support substrate, a high acoustic velocity film provided on the support substrate, a low acoustic velocity film provided on the high acoustic velocity film, and a piezoelectric thin film provided on the low acoustic velocity film. Alternatively, the substrate 100 may have piezoelectricity in the entire substrate.

Each IDT electrode 10 is provided on the substrate 100. Each IDT electrode 10 includes a plurality of electrode fingers and a pair of busbar electrodes disposed on opposite sides with the plurality of electrode fingers interposed therebetween. The electrode fingers are alternately connected to one and the other of the pair of busbar electrodes. In other words, each IDT electrode 10 includes a pair of interdigitated comb-shaped electrodes. Each of the pair of comb-shaped electrodes includes a plurality of electrode fingers and a single busbar electrode that connects the plurality of electrode fingers. The plurality of electrode fingers are disposed along a direction perpendicular or substantially perpendicular to a propagation direction of elastic waves, and are periodically disposed along the propagation direction. Each IDT electrode 10 defines a single surface acoustic wave resonator together with the substrate 100. One or more IDT electrodes 10 are provided on the substrate 100.

The wires 20 are provided on the substrate 100 and are connected to the IDT electrodes 10. With this configuration, the wires 20 propagate electric signals to the IDT electrodes 10 or lead out electric signals from the IDT electrodes 10. One or more wires 20 are provided on the substrate 100. Each of the one or more wires 20 is connected to at least one of the one or more IDT electrodes 10.

The wires 20 and the IDT electrodes 10 may be formed in the same process using the same electrically conductive material. However, as illustrated in FIG. 1, the film thickness of each IDT electrode 10 and the film thickness of each wire 20 may be different from each other, and preferably, the film thickness of each wire 20 is greater than the film thickness of each IDT electrode 10. Because the film thickness of each IDT electrode 10 significantly affects propagation characteristics, such as frequency, of surface acoustic waves that propagate through the IDT electrode 10, the film thickness is set to a film thickness that reflects the propagation characteristics. In contrast to this, since each wire 20 is a medium that propagates mechanical signals of elastic waves as electric signals, the wire 20 has a shape with a small conductor loss. Therefore, the film thickness of each wire 20 is often set so as to be greater than the film thickness of each IDT electrode 10. A plurality of film-forming processes are preferably used as a method of thickening each wire 20 as compared to each IDT electrode 10. First, a lower layer of each wire 20 and each IDT electrode 10 are formed in the same process, and, after that, only an upper layer of each wire 20 is formed. Even when each wire 20 and each IDT electrode 10 are not formed in the same process, the film thickness of each IDT electrode 10 and the film thickness of each wire 20 may be different from each other, and preferably the film thickness of each wire 20 is greater than the film thickness of each IDT electrode 10.

The electrically insulating film 30 is provided at least on the IDT electrodes 10 and the wires 20. In the present preferred embodiment, the electrically insulating film 30 covers a surface of the substrate 100, the IDT electrodes 10, and the wires 20. The surface of the substrate 100 is a surface of the substrate 100, on which the IDT electrodes 10 and the wires 20 are provided. The electrically insulating film 30 is preferably made of, for example, silicon oxide. Alternatively, the electrically insulating film 30 may have a structure in which a dielectric or insulator, such as silicon nitride, for example, is laminated on silicon oxide. The electrically insulating film 30 protects each IDT electrode 10 and each wire 20 from an external environment (increasing moisture resistance) and adjusts the frequency-temperature characteristics of the surface acoustic wave resonator including each IDT electrode 10 and the substrate 100. In the present preferred embodiment, the electrically insulating film 30 is preferably made of, for example, silicon oxide. The film thickness of, particularly, a portion provided on each IDT electrode 10 within the electrically insulating film 30 affects the frequency of the elastic wave device 1, and therefore, it is preferable that the film thickness of the portion provided on each IDT electrode 10 is uniform or substantially uniform.

The identification marking 35 is an identification pattern including an uneven portion of the surface of the electrically insulating film 30. With a stepwise change in film thickness in the uneven portion, the identification marking 35 is recognizable in plan view of the substrate 100. The surface of the electrically insulating film 30 in this specification is defined as, of two main surfaces of the electrically insulating film 30, a surface including the main surface facing away from the substrate 100. The identification marking 35 is any one of a symbol, a character, a numeral, a figure (including a barcode), and a combination of two or more of these. Examples of the identification marking 35 include the location information of each elastic wave device in a wafer that is an aggregate of the plurality of elastic wave devices 1, a lot number indicating a serial number, and a delivery inspection marking. That is, the identification marking 35 identifies each elastic wave device 1 during manufacturing and after manufacturing of the elastic wave device 1.

As illustrated in FIG. 2, in plan view of the substrate 100, the identification marking 35 does not overlap the IDT electrodes 10.

With this configuration, since the identification marking 35 is made of an electrically insulating material, and not the electrically conductive material provided on the substrate 100, deterioration of the propagation characteristics of surface acoustic waves that propagate through each IDT electrode 10 under the electromagnetic effect of the identification marking 35 is reduced or prevented. Furthermore, since the identification marking 35 does not overlap the IDT electrodes 10 in plan view, nonuniform frequency in the elastic wave device 1 resulting from a change in the film thickness of the electrically insulating film 30 due to the identification marking 35 is prevented, and therefore, deterioration of the propagation characteristics of surface acoustic waves that propagate through each IDT electrode 10 is reduced or prevented. In addition, since the identification marking 35 is defined by the electrically insulating film 30 that is required and always included to ensure the reliability of the elastic wave device 1 and no new additional material is required for the identification marking 35, the size of the elastic wave device 1 is able to be reduced.

In the present preferred embodiment, the identification marking 35 is a recess provided on the surface of the electrically insulating film 30 by removing an electrically insulating material, and a bottom of the recess does not extend to the surface of the substrate 100. When there is a portion on the surface of the substrate 100 at which the electrically insulating film 30 is not provided and the surface of the substrate 100 is exposed, cracking or chipping of the substrate 100 is highly likely to occur from that portion. In contrast, in the present preferred embodiment, since the bottom of the recess does not extend to the surface of the substrate 100, cracking or chipping of the substrate 100 is reduced or prevented.

Figure 3A:
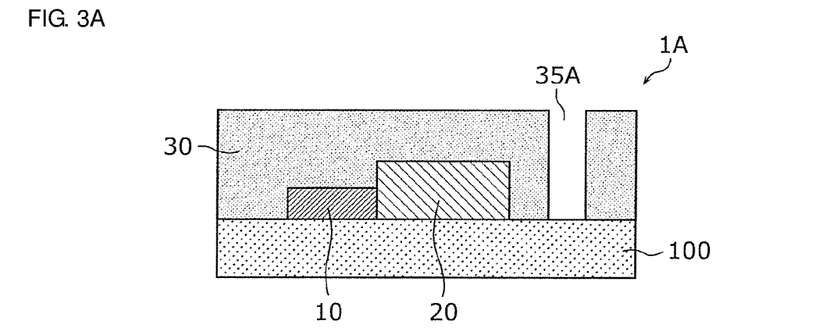
FIG. 3A is a sectional view of an elastic wave device according to a Modification 1 of a preferred embodiment of the present invention.

FIG. 3A is a sectional view of an elastic wave device 1A according to a Modification 1 of a preferred embodiment of the present invention. The elastic wave device 1A according to the present modification includes the substrate 100, the IDT electrodes 10, the wires 20, the electrically insulating film 30, and an identification marking 35A. The plan configuration of the elastic wave device 1A according to the present modification is the same or substantially the same as the plan configuration illustrated in FIG. 2. The elastic wave device 1A according to the present modification differs from the elastic wave device 1 according to the present preferred embodiment only in the structure of the identification marking. Hereinafter, for the elastic wave device 1A according to the present modification, the description of the same or similar components and/or configurations ("and/or configurations" are omitted for simplification hereafter) as those of the elastic wave device 1 according to the present preferred embodiment is omitted, and different components will be mainly described.

As illustrated in FIG. 2, in plan view of the substrate 100, the identification marking 35A does not overlap the IDT electrodes 10.

With this configuration, since the identification marking 35A is made of an electrically insulating material and not the electrically conductive material provided on the substrate 100, deterioration of the propagation characteristics of surface acoustic waves that propagate through each IDT electrode 10 under the electromagnetic effect of the identification marking 35A is reduced or prevented. Furthermore, since the identification marking 35A does not overlap the IDT electrodes 10 in the plan view, deterioration of uniform frequency is reduced or prevented. In addition, since the identification marking 35A is defined by the electrically insulating film 30 and no new additional material are required for the identification marking 35A, the size of the elastic wave device 1A is able to be reduced.

In the present modification, the identification marking 35A is a recess provided on the surface of the electrically insulating film 30 by removing an electrically insulating material, and a bottom of the recess extends the surface of the substrate 100. With this configuration, a large step of the recess to recognize the identification marking 35A is ensured, and therefore, an identification marking may be more readily recognizable.

Figure 3B:
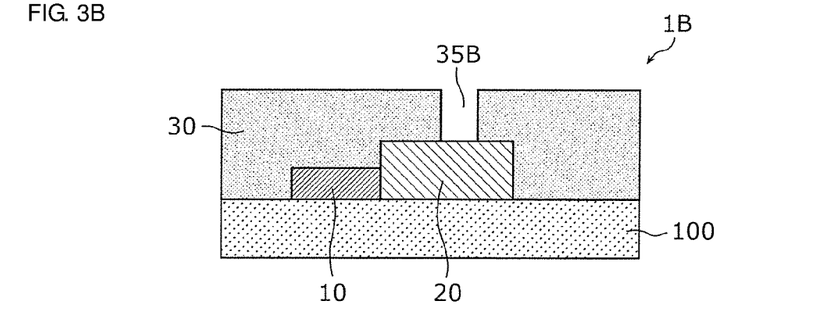
FIG. 3B is a sectional view of an elastic wave device according to a Modification 2 of a preferred embodiment of the present invention.

FIG. 3B is a sectional view of an elastic wave device 1B according to a Modification 2 of a preferred embodiment of the present invention. The elastic wave device 1B according to the present modification includes the substrate 100, the IDT electrodes 10, the wires 20, the electrically insulating film 30, and an identification marking 35B. The elastic wave device 1B according to the present modification differs from the elastic wave device 1 according to the present preferred embodiment only in the location of the identification marking. That is, the plan configuration of the elastic wave device 1B according to the present modification differs from the plan configuration illustrated in FIG. 2 in that the identification marking is disposed at a location that overlaps at least one of the wires 20. Hereinafter, for the elastic wave device 1B according to the present modification, the description of the same or similar components as those of the elastic wave device 1 according to the preferred embodiment is omitted, and different components will be mainly described.

In plan view of the substrate 100, the identification marking 35B does not overlap the IDT electrodes 10 and overlaps at least one of the wires 20.

The identification marking 35B is made of an electrically insulating material and the electrically conductive material provided on the substrate 100. In addition, the electrically insulating film 30 on the wires 20 defines and functions as a protective film but does not directly affect the propagation characteristics of the elastic wave device 1. With this configuration, deterioration of the propagation characteristics of surface acoustic waves that propagate through each IDT electrode 10 due to the electromagnetic effect of the identification marking 35B is reduced or prevented. Furthermore, since the identification marking 35B does not overlap the IDT electrodes 10 in the plan view, deterioration of uniform frequency is reduced or prevented. In addition, since the identification marking 35B is defined by the electrically insulating film 30, no new additional material is required for the identification marking 35B. Furthermore, since the identification marking 35B overlaps at least one of the wires 20 in the plan view, no additional space to dispose the identification marking 35B is required at a portion at which neither the IDT electrodes 10 nor the wires 20 are provided. With these configurations, the size of the elastic wave device 1B is able to be further reduced.

In the present modification, the identification marking 35B is a recess provided on the surface of the electrically insulating film 30 by removing an electrically insulating material, and a bottom of the recess extends to the surface of at least one of the wires 20. Alternatively, the bottom of the recess does not need to extend to the surface of any one of the wires 20.

Figure 4:
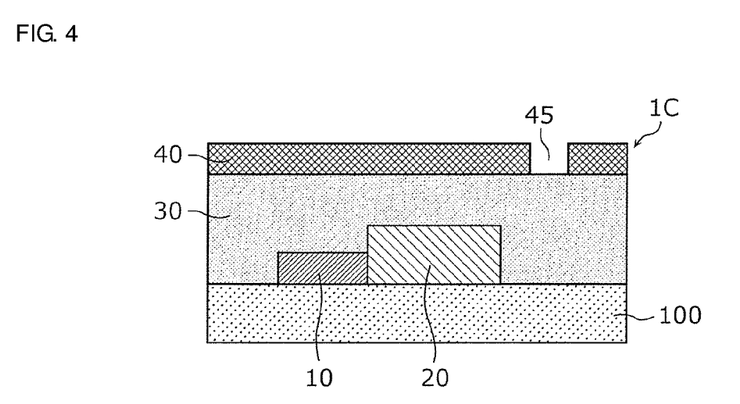
FIG. 4 is a sectional view of an elastic wave device according to a Modification 3 of a preferred embodiment of the present invention.

FIG. 4 is a sectional view of an elastic wave device 1C according to a Modification 3 of a preferred embodiment of the present invention. The elastic wave device 1C according to the present modification includes the substrate 100, the IDT electrodes 10, the wires 20, the electrically insulating film 30, an electrically insulating film 40, and an identification marking 45. The plan configuration of the elastic wave device 1C according to the present modification is the same or substantially the same as the plan configuration illustrated in FIG. 2. The elastic wave device 1C according to the present modification differs from the elastic wave device 1 according to the present preferred embodiment in the configuration of the electrically insulating film and the structure of the identification marking. Hereinafter, for the elastic wave device 1C according to the present modification, the description of the same or similar components as those of the elastic wave device 1 according to the present preferred embodiment is omitted, and different components will be mainly described.

The electrically insulating film 30 is provided at least on the IDT electrodes 10 and the wires 20. In the present modification, the electrically insulating film 30 covers the surface of the substrate 100, the IDT electrodes 10, and the wires 20. The electrically insulating film 30 is preferably made of, for example, silicon oxide.

The electrically insulating film 40 is laminated on the electrically insulating film 30. In the present modification, the electrically insulating film 40 covers the electrically insulating film 30 other than a region at which the identification marking 45 is provided. The electrically insulating film 40 is preferably made of, for example, silicon nitride.

Since the electrically insulating film 30 made of silicon oxide has a temperature coefficient different in sign from the temperature coefficient of the substrate 100, frequency-temperature characteristics are improved, and therefore, the electrically insulating film 30 is disposed so as to be in direct contact with the IDT electrodes 10 and the wires 20. On the other hand, since the electrically insulating film 40 made of silicon nitride differs from the electrically insulating film 30 made of silicon oxide in that a dense film is easily provided and it is advantageous in moisture resistance, metal diffusion prevention, and other characteristics, the electrically insulating film 40 is disposed as an outermost layer.

The electrically insulating films 30 and 40 protects the IDT electrodes 10 and the wires 20 from an external environment (increasing moisture resistance) and adjust the frequency-temperature characteristics of the surface acoustic wave resonator including each IDT electrode 10 and the substrate 100.

In plan view of the substrate 100, the identification marking 45 does not overlap the IDT electrodes 10. In addition, the identification marking 45 is a recess provided on the surface of the electrically insulating film 40 by removing the electrically insulating material of the electrically insulating film 40, and a bottom of the recess extends to the surface of the electrically insulating film 30. With this configuration, although the electrically insulating film 40 is removed, since the electrically insulating film 30 is not removed in a region at which the identification marking 45 is provided, deterioration of environmental resistance and frequency-temperature characteristics is reduced or prevented.

Figure 5A:
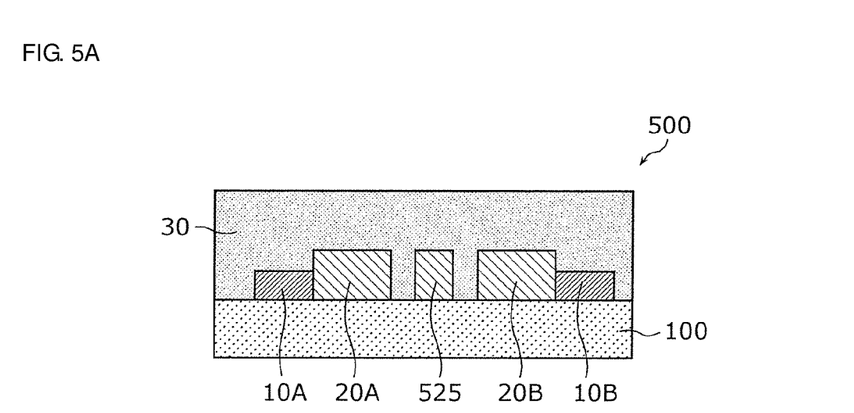
FIG. 5A is a sectional view of an elastic wave device according to a comparative example.

FIG. 5A is a sectional view of an elastic wave device 500 according to a comparative example. The elastic wave device 500 according to the comparative example illustrated in FIG. 5A includes the substrate 100, IDT electrodes 10A and 10B, wires 20A and 20B, the electrically insulating film 30, and an identification marking 525. The wire 20A and the wire 20B are at different potentials.

In the elastic wave device 500 according to the comparative example, the two IDT electrodes 10A and 10B and the two wires 20A and 20B are disposed on the substrate 100. The wire 20A is connected to the IDT electrode 10A. The wire 20B is connected to the IDT electrode 10B. The identification marking 525 is made of a metal material and is in contact with the surface of the substrate 100. In plan view of the substrate 100, the identification marking 525 is disposed between the wires 20A and 20B. The electrically insulating film 30 covers the surface of the substrate 100, the IDT electrodes 10A and 10B, the wires 20A and 20B, and the identification marking 525. In the present comparative example, the electrically insulating film 30 is transparent.

With the above-described configuration of the elastic wave device 500 according to the comparative example, the identification marking 525 is made of a metal material, and the identification marking 525 is disposed between the wires 20A and 20B that propagate a radio-frequency signal both in plan view of the substrate 100 and in sectional view of the substrate 100.

When the identification marking 525 is disposed in a region between the two wires 20A and 20B facing each other, the capacitance of the region, provided by the electrically insulating film 30, fluctuates. Thus, elastic wave propagation characteristics are deteriorated.

In contrast to this, it is preferable that, in the elastic wave device according to the preferred embodiment of the present invention described above, an identification marking is provided in the plan view in a region other than a region between two wires facing each other.

Figure 5B:
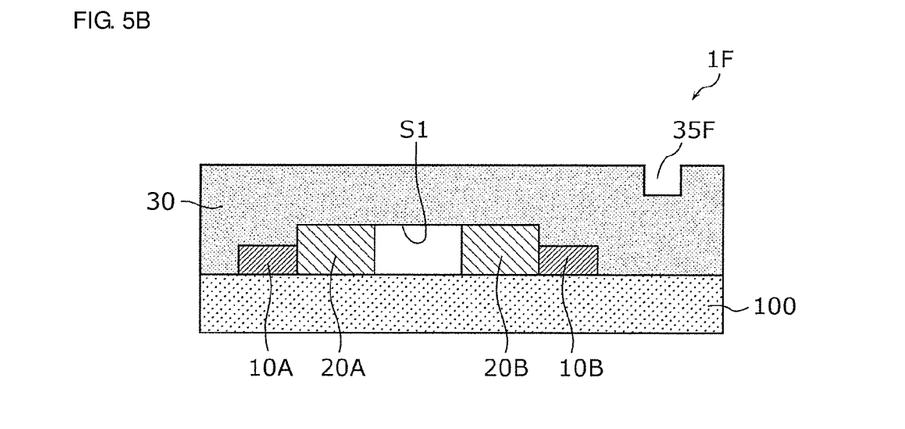
FIG. 5B is a sectional view of an elastic wave device according to a Modification 6 of a preferred embodiment of the present invention for describing a region in which no identification marking is disposed.

FIG. 5B is a sectional view of an elastic wave device 1F according to a Modification 6 of a preferred embodiment of the present invention to illustrate a region at which no identification marking is disposed. As illustrated in FIG. 5B, an identification marking 35F is provided in a region other than a region S1 between the two wires 20A and 20B facing each other. The region S1 between the two wires 20A and 20B facing each other is a region interposed between the wires 20A and 20B, and is a region at which the shortest (the strongest) line of electric force is generated between the wires 20A and 20B.

When the identification marking is provided in a region other than the above-described region, fluctuations in the capacitance of the region between the two wires facing each other are reduced or prevented, and therefore, fluctuations in the propagation characteristics of the elastic wave device are able to be reduced or prevented.

Figure 6:
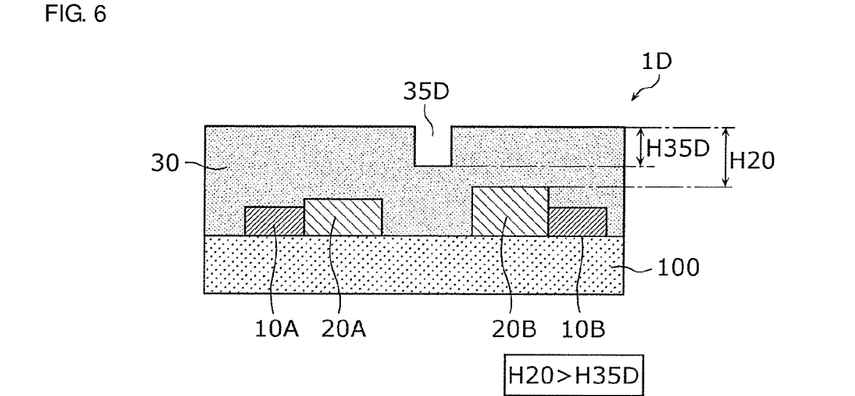
FIG. 6 is a sectional view of an elastic wave device according to a Modification 4 of a preferred embodiment of the present invention.

FIG. 6 is a sectional view of an elastic wave device 1D according to a Modification 4 of a preferred embodiment of the present invention. The elastic wave device 1D according to the present modification includes the substrate 100, the IDT electrodes 10A and 10B, the wires 20A and 20B, the electrically insulating film 30, and an identification marking 35D. The elastic wave device 1D according to the present modification differs from the elastic wave device 1 according to the preferred embodiment described above in that, in plan view of the substrate 100, the identification marking 35D is disposed between the two wires 20A and 20B facing each other. Hereinafter, for the elastic wave device 1D according to the present modification, the description of the same or similar components as those of the elastic wave device 1 according to the preferred embodiment described above is omitted, and different components will be mainly described.

Each of the IDT electrodes 10A and 10B is provided on the substrate 100. Each of the IDT electrodes 10A and 10B includes a plurality of electrode fingers and a pair of busbar electrodes disposed on opposite sides with the plurality of electrode fingers interposed therebetween. The plurality of electrode fingers is alternately connected to one and the other of the pair of busbar electrodes.

Each of the wires 20A and 20B is provided on the substrate 100. The wire 20A is connected to the IDT electrode 10A. The wire 20B is connected to the IDT electrode 10B.

The electrically insulating film 30 is provided at least on the IDT electrodes 10A and 10B and the wires 20A and 20B. In the present modification, the electrically insulating film 30 covers the surface of the substrate 100, the IDT electrodes 10A and 10B, and the wires 20A and 20B.

The identification marking 35D is defined by an uneven portion of the surface of the electrically insulating film 30. With a stepwise change in film thickness in the uneven portion, the identification marking 35D is recognizable in plan view of the substrate 100. In the present modification, the identification marking 35D is a recess provided on the surface of the electrically insulating film 30 by removing an electrically insulating material, and a bottom of the recess does not extend to the surface of the substrate 100. In plan view of the substrate 100, the identification marking 35D does not overlap the IDT electrodes 10A and 10B.

In the plan view, the identification marking 35D is disposed between the two wires 20A and 20B facing each other. As illustrated in FIG. 6, a distance H35D in the direction normal or substantially normal to the substrate 100 from the surface of the electrically insulating film 30 to the bottom of the recess of the identification marking 35D is less than a minimum distance H20 in the direction normal or substantially normal to the substrate 100 from the surface to the two wires 20A and 20B.

Even when the identification marking 35D is disposed in a region between the two wires 20A and 20B facing each other in the plan view but when no identification marking is disposed in a region surrounded by the two wires 20A and 20B (the region S1 in FIG. 5B) in the sectional view of the substrate 100, lines of electric force that are generated by the two wires 20A and 20B are less likely to be affected by the identification marking 35D. Thus, with the configuration of the present modification, since fluctuations in the capacitance of the region are reduced or prevented, fluctuations in the propagation characteristics of the elastic wave device 1D are reduced or prevented.

Figure 7:
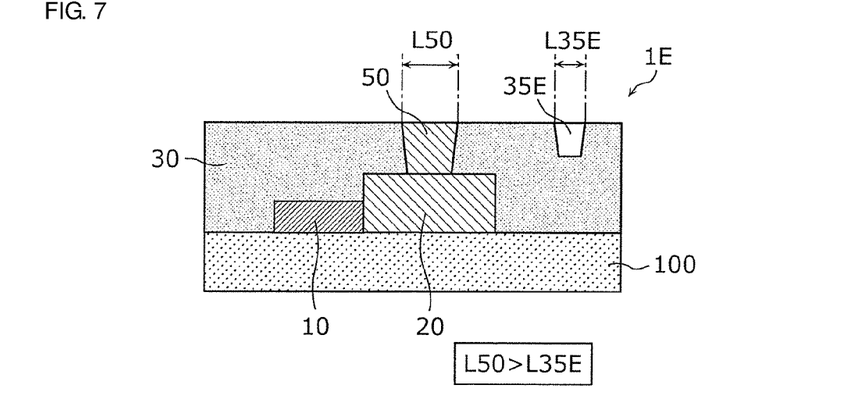
FIG. 7 is a sectional view of an elastic wave device according to a Modification 5 of a preferred embodiment of the present invention.

FIG. 7 is a sectional view of an elastic wave device 1E according to a Modification 5 of a preferred embodiment of the present invention. The elastic wave device 1E according to the present modification includes the substrate 100, the IDT electrodes 10, the wires 20, the electrically insulating film 30, a via conductor 50, and an identification marking 35E. The elastic wave device 1E according to the present modification differs from the elastic wave device 1 according to the preferred embodiment described above in that the elastic wave device 1E includes the via conductor 50. Hereinafter, for the elastic wave device 1E according to the present modification, the description of the same or similar components as those of the elastic wave device 1 according to the preferred embodiment described above is omitted, and different components will be mainly described.

One end of the via conductor 50 is in contact with the surface of any one of the wires 20, and the other end of the via conductor 50 is exposed to the surface of the electrically insulating film 30. The via conductor 50 extends through the electrically insulating film 30 on any one of the wires 20. The other end of the via conductor 50 is connected to an external substrate, or other suitable structure, via a bump, solder, for example. Alternatively, the other end of the via conductor 50 is connected to an external circuit via an electrode wire provided on the surface of the electrically insulating film 30.

The identification marking 35E is a recess provided on the surface of the electrically insulating film 30. With a stepwise change in film thickness in the recess, the identification marking 35E is recognizable in plan view of the substrate 100. In plan view of the substrate 100, the identification marking 35E does not overlap the IDT electrodes 10. In addition, the area of the opening of the recess defining the identification marking 35E on the surface of the electrically insulating film 30 is less than the area in which the via conductor 50 is provided on the surface of the electrically insulating film 30.

When a plurality of recesses are provided in the electrically insulating film 30 at the same time with a resist pattern by dry etching, or other suitable method, the formed recess becomes deeper as the area of the opening of the resist pattern increases. From this viewpoint, in the present modification, the area of the opening of the recess defining the identification marking 35E is less than the area in which the via conductor 50 is provided (the area of the opening of the via recess which is filled with the via conductor 50) on the surface of the electrically insulating film 30. Thus, even when the electrically insulating film 30 is etched until the surface of the corresponding wire 20 is exposed to form a via recess, the bottom of the recess of the identification marking 35E is shallower than the bottom of the via recess. Thus, exposure of the substrate 100 to the bottom of the recess defining the identification marking 35E is prevented, and therefore development of cracking or other defects are reduced or prevented in the substrate 100, and deterioration of the characteristics of the elastic wave device 1E is reduced or prevented.

When a plurality of recesses are provided in the electrically insulating film 30, more specifically, the recess becomes deeper as the minimum diameter of the area of the opening of a resist pattern increases. This is because, as the minimum diameter increases, etching gas that is used for dry etching, or other suitable method, more easily extends the openings of the resist pattern and the recesses of the electrically insulating film 30.

From this viewpoint, the minimum diameter of the opening of the recess defining the identification marking 35E is preferably less than the minimum diameter of the via conductor 50 on the surface of the electrically insulating film 30.

Thus, even when the electrically insulating film 30 is etched until the surface of the corresponding wire 20 is exposed to form the via recess, the bottom of the recess defining the identification marking 35E is shallower than the bottom of the via recess. Thus, exposure of the substrate 100 to the bottom of the recess that is the identification marking 35E is prevented, and therefore, development of cracking or other defects in the substrate 100 is reduced or prevented, and deterioration of the characteristics of the elastic wave device 1E is reduced or prevented.

The elastic wave devices according to the present invention are described with reference to the preferred embodiments and the modifications. However, the present invention is not limited to the above-described preferred embodiments and modifications. The present invention also preferably encompasses other preferred embodiments obtained by combining selected elements of the above-described preferred embodiments and modifications, modifications obtained by applying various modifications that are conceived of by persons skilled in the art to the above-described preferred embodiments and modifications without departing from the purport of the present invention, and various devices that include the elastic wave devices according to preferred embodiments of the present invention and modifications.

The elastic wave devices according to preferred embodiments of the present invention and modifications may be, for example, configured such that a plurality of surface acoustic wave filters are disposed on a single piezoelectric substrate.

In the above-described preferred embodiments and modifications, the elastic wave devices including the surface acoustic wave resonator are illustrated. The surface acoustic waves in the above-described preferred embodiments and modifications include propagating elastic waves through the surface of a piezoelectric body or the interface between a plurality of materials, and represent various types of elastic waves that are generated using an IDT electrode. Examples of the surface acoustic waves include surface waves, Love waves, leaky waves, Rayleigh waves, boundary waves, leaky SAW, pseudo-SAW, and plate waves.

The preferred embodiments of the present invention and modifications are widely usable in communication equipment, such as mobile communication terminals, as a low-loss and small radio-frequency filter, a duplexer, a multiplexer, and a resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a substrate having piezoelectricity;
   an interdigital transducer (IDT) electrode provided on the substrate and including a pair of comb-shaped electrodes facing each other;
   a wire provided on the substrate, connected to the IDT electrode, and structured to propagate an electric signal to the IDT electrode or lead out an electric signal from the IDT electrode;
   an electrically insulating film provided at least on the IDT electrode and the wire; and
   an identification marking defined by an uneven portion of a surface of the electrically insulating film; wherein
   the identification marking does not overlap the IDT electrode in a plan view of the substrate; and
   the identification mark overlaps the substrate in the plan view of the substrate and is provided on a same side of the substrate on which the IDT electrode is provided.

2. The elastic wave device according to claim 1, further comprising:
   a via conductor provided on the wire and extending through the electrically insulating film; wherein
   the identification marking is a recess on the surface of the electrically insulating film; and
   in the plan view, an area of an opening of the recess in the surface is less than an area in which the via conductor is provided in the surface.

3. The elastic wave device according to claim 2, wherein, in the plan view, a minimum diameter of the opening of the recess is less than a minimum diameter of the via conductor in the surface.

4. The elastic wave device according to claim 1, wherein the wire includes a plurality of wires provided on the substrate and connected to the IDT electrode to propagate the electric signal to the IDT electrode or lead out the electric signal from the IDT electrode; and
   in the plan view, the identification marking is disposed in a region other than a region between two of the plurality of wires facing each other.

5. The elastic wave device according to claim 1, wherein the wire includes a plurality of wires provided on the substrate and connected to the IDT electrode to propagate the electric signal to the IDT electrode or lead out the electric signal from the IDT electrode;
   the identification marking is a recess on the surface of the electrically insulating film;
   in the plan view, the identification marking is disposed between two of the plurality of wires facing each other; and
   a distance in a direction normal or substantially normal to the substrate from the surface to a bottom of the recess is less than a minimum distance in the direction normal or substantially normal to the substrate from the surface to the two of the plurality of wires.

6. The elastic wave device according to claim 1, wherein, in the plan view, the identification marking overlaps at least a portion of the wire.

7. The elastic wave device according to claim 6, wherein the identification marking extends to a surface of the wire.

8. The elastic wave device according to claim 1, wherein a thickness of the wire is different from a thickness of the IDT electrode.

9. The elastic wave device according to claim 8, wherein the thickness of the wire is greater than the thickness of the IDT electrode.

10. The elastic wave device according to claim 1, wherein a thickness of the electrically insulating film is uniform.

11. The elastic wave device according to claim 1, wherein the identification marking is at least one of a symbol, a character, a numeral, and a figure.

12. The elastic wave device according to claim 1, wherein, in the plan view, the identification marking does not overlap at least a portion of the wire.

13. The elastic wave device according to claim 1, wherein the identification marking does not extend to a surface of the substrate.

14. The elastic wave device according to claim 1, wherein the identification marking extends to a surface of the substrate.

15. The elastic wave device according to claim 1, wherein the electrically insulating film is made of silicon oxide.

16. The elastic wave device according to claim 1, wherein the electrically insulating film includes a first electrically insulating film provided at least on the IDT electrode, and a second electrically insulating film provided on the first electrically insulating film.

17. The elastic wave device according to claim 16, wherein the first electrically insulating film is made of silicon oxide.

18. The elastic wave device according to claim 16, wherein the second electrically insulating film is made of silicon nitride.

19. The elastic wave device according to claim 16, wherein the identification marking is defined by an uneven portion of a surface of the second electrically insulating film.

20. The elastic wave device according to claim 19, wherein the identification marking extends to a surface of the first electrically insulating film.

* * * * *